United States Patent
Klippel

[11] Patent Number: 5,694,476
[45] Date of Patent: Dec. 2, 1997

[54] ADAPTIVE FILTER FOR CORRECTING THE TRANSFER CHARACTERISTIC OF ELECTROACOUSTIC TRANSDUCER

[76] Inventor: Wolfgang Klippel, 326 Longview Pl., Thousand Oaks, Calif. 91360

[21] Appl. No.: 306,677

[22] Filed: Sep. 15, 1994

[30] Foreign Application Priority Data

Sep. 27, 1993 [DE] Germany .................. 43 32 804.0

[51] Int. Cl.$^6$ .................................................. H04R 3/00
[52] U.S. Cl. .................... 381/96; 381/59; 381/98; 381/55
[58] Field of Search .................... 381/104, 107, 381/108, 106, 96, 98, 59, 55; 330/279, 129, 278

[56] References Cited

FOREIGN PATENT DOCUMENTS 0223097 12/1984 Japan .................. 381/96

*Primary Examiner*—Minsun Oh

[57] ABSTRACT

An arrangement is provided for converting an electric signal into an acoustic or a mechanic signal comprising a transducer (11), a linear or nonlinear filter (1) with controllable parameters, a sensor (12), a controller (24), a reference filter (20) and a summer (17). The filter (1) is connected to the electric input of the transducer and is adaptively adjusted to compensate for the linear and/or nonlinear distortions of the transducer and to realize a desired overall transfer characteristic. The filter has for every controllable filter parameter an additional output (7) supplying a gradient signal to the controller and a control input (10). The summer (17) provides an error signal derived from the sensor output and reference filter output. The controller contains a circuit (53) for filtering the gradient signal and/or a circuit (25) for filtering the error signal, a multiplier (51) and an integrator (57) for producing a control signal to update every filter parameter. This arrangement omits off-line pre-training and adapts on-line for changing transducer characteristics caused by temperature, ageing and so on.

10 Claims, 6 Drawing Sheets

1

ADAPTIVE FILTER FOR CORRECTING THE TRANSFER CHARACTERISTIC OF ELECTROACOUSTIC TRANSDUCER

CROSS-REFERENCES TO RELATED APPLICATIONS

Reference is made to the following U.S. patent applications

U.S. application Ser. No. 07/867,314 filed April 1992 by W. Klippel entitled CORRECTION OF LINEAR TRANSFER CHARACTERISTICS AND REDUCTION OF NONLINEAR DISTORTION FOR ELECTROACOUSTIC TRANSDUCERS.

U.S. application Ser. No. 04/709,391 filed May 30, 1985 by A. Kaizer entitled ARRANGEMENT FOR CONVERTING AN ELECTRIC SIGNAL INTO AN ACOUSTIC SIGNAL OR VICE VERSA AND A NON-LINEAR NETWORK FOR USE IN THE ARRANGEMENT.

and to the other publications

Koh, T. and Powers, E. J.: Second-order Volterra filtering and its application to nonlinear system identification, IEEE Trans. Acoust. Speech Signal Process. Vol. ASSP-33 No. 6 December 1985, pp. 1445–55.

Kaizer, A. J.: Modeling of the Nonlinear Response of an Electrodynamic Loudspeaker by a Volterra Series Expansion, J. Audio Eng. Soc. 35 (1987) 6, p. 421.

Frank, W. et. al.: Lautsprecherlinearisierung in Echtzeit mit Hilfe digitaler Vorentzerrung, 19. Tagung der Deutschen Arbeitsgemeinschaft für Akustik (DAGA '93), in Proc. Fortschritte der Akustik (1993).

Klippel, W.: The Mirror filter—a New Basis for Reducing Nonlinear Distortion Reduction and Equalizing Response in Woofer Systems, J. Audio Eng. Soc. 32 (9), pp. 675–691, (1992).

Mathews, V. J.: Adaptive Polynomial Filters, IEEE Signal Processing Magazine, pp. 10–26, July (1991).

Palmieri F. et. al.: A class of nonlinear adaptive filters, ICASSP 88: 1988 International Conference on Acoustics, Speech and Signal Processing (Cat. No. 88CH2561-9) 1988, pp. 1483–6 vol. 3.

Gao, F. X. Y.: Adaptive Linearization of a Loudspeaker, presented at the 93rd Convention of Audio Engineering Society, Oct. 1–4, 1992 San Francisco, Preprint 3377.

BACKGROUND OF THE INVENTION

1. Field of the Invention

The invention relates to an arrangement for converting an electric signal into an acoustic or a mechanic signal comprising a transducer, a linear or nonlinear filter with controllable parameters, a sensor for sensing an electric, a mechanic or an acoustic signal at the transducer and a controller. The filter is adaptively adjusted to the transducer to compensate for linear or nonlinear distortions of the transducer on-line and to realize a desired overall transfer characteristic of the arrangement without pre-training.

2. Description of the Prior Art

Transducers converting an electric signal into a mechanic or an acoustic signal, such as loudspeakers, headphones and actuators, produce substantial linear and nonlinear distortions in the output signal. These distortions affect the quality of sound reproduction systems or impair the efficiency of active attenuation systems in professional applications.

An electric filter connected to the input terminals of the transducer can compensate for these distortions if the filter shows the inverse transfer characteristic of the transducer.

The linear distortions of the transducer can be corrected by straightforward linear filters (e.g. FIR-filter, IIR-filter). Nonlinear filters for compensating for nonlinearities in the transducer were developed by two different approaches:

1. In a generic approach based on nonlinear system theory the relationship between the electric input and the acoustic or mechanic output signal is described by higher-order system functions using the VOLTERRA-series expansion as described in Schertzen, M.: The Volterra and Wiener Theories of Nonlinear Systems, New York: Wiley, 1980. The system functions of the transducer are inverted and implemented in polynomial filters as described by Koh, T. and Powers, E. J.: Second-order Volterra filtering and its application to nonlinear system identification, IEEE Trans. Acoust. Speech Signal Process. Vol. ASSP-33 No. 6 December 1985, pp. 1445–55. This technique was applied to the distortion reduction in loudspeakers by Kaizer, A. J.: Modeling of the Nonlinear Response of an Electrodynamic Loudspeaker by a Volterra Series Expansion. J. Audio Eng. Soc. 35 (1987) 6, p. 421 and by Frank, W. et. al.: Lautsprecherlinearisierung in Echtzeit mit Hilfe digitaler Vorentzerrung, 19. Tagung der Deutschen Arbeitsgemeinschaft für Akustik (DAGA '93), in Proc. Fortschritte der Akustik. The system functions can be derived from the transducer model, e.g. lumped-parameter model, or can be measured directly. The generic filter design is advantageous to compensate for nonlinearities with a complex structure which can not be modeled completely, e.g. the partial vibration of the cone.

2. The alternative approach is based on a complete modeling of the nonlinear mechanisms in the transducer. A special transducer oriented filter structure can be derived from the nonlinear differential equation as described by Klippel, W.: The Mirror filter—a New Basis for Reducing Nonlinear Distortion Reduction and Equalizing Response in Woofer Systems, J. Audio Eng. Soc. 32 (9), S. 675–691, (1992). This filter comprises a minimum of linear and nonlinear subsystems and is directly related to the physical mechanisms in the transducer. It can be implemented in digital signal processors at low costs and is not restricted to low-order distortion reduction as the polynomial filter based on a truncated VOLTERRA-series expansion.

The free parameters of the correction filter have to be adjusted to the particular transducer to achieve the optimal distortion reduction. There are two different strategies for adjusting the correction filter:

A. In the first strategy the transducer is disconnected from the correction filter and the transducer parameters are measured directly or are determined by system identification techniques. In a second step the filter parameters are calculated from the transducer parameters and implemented in the filter. The filter is then coupled to the transducer and the parameters are not changed for the duration of the operation. However, errors during the parameter measurement and changes of the parameters over time will cause a maladjustment of the filter and impaired distortion reduction.

B. Alternatively, the transducer is connected with the filter during adjustment and the transfer characteristic of the total system is measured and the filter parameter are adjusted to obtain the desired overall response.

An automatic adjustment system based on the second strategy is disclosed in the co-pending U.S. patent application Ser. No. 07/867,314 filed April 1992 by W. Klippel entitled CORRECTION OF LINEAR TRANSFER CHARACTERISTICS AND REDUCTION OF NONLINEAR DISTORTION FOR ELECTROACOUSTIC TRANSDUCERS. During learning the filter is disconnected from the audio input and is connected to a signal generator supplying a two-tone signal. An acoustic signal at the loudspeaker is sensed by a microphone and supplied to a controller to determine the optimal filter parameters. At the end of the filter adjustment the parameters are stored and the filter input is reconnected to the audio input. This adjustment system requires a special learning routine and is not activated in the normal working mode reproducing an audio signal. Alteration of the transducer parameters due to heat, ageing and fatigue can not be compensated for automatically.

A permanent adjustment of the correction filter requires adaptive nonlinear filters. The straightforward adaptive filters proposed by Mathews, V. J.: Adaptive Polynomial Filters, IEEE Signal Processing Magazine, July 1991, p. 10–26, and Palmieri, F. et. al.: A class of nonlinear adaptive filters, ICASSP 88: 1988 International Conference on Acoustics, Speech and Signal Processing (Cat. No. 88CH2561-9) 1988 pp. 1483–6 vol. 3 can not be applied to the adjustment strategy B where the filter output is connected to the transducer input. The used algorithms for updating the filter parameters requires that the filter input is connected to the output of the transducer-sensor-system. An error signal is generated by comparing the filter output signal with a desired signal generated by a linear reference filter and is provided for updating the adaptive filter. This arrangement allows to correct the total system response but the reproduced sound signal at the output of the transducer and at the input of the adaptive filter remains distorted. The adjusted filter with frozen parameters can only be connected to the input of the transducer if both linear and nonlinear distortions are corrected completely and the total system shows the transfer response $H_{total}(s)=1$. However, it is not practicable to equalize the linear response of a loudspeaker system below the cut-off frequency.

A solution for this problem was found by Gao, F. X. Y.: Adaptive Linearization of a Loudspeaker, presented at the 93rd Convention of Audio Engineering Society, Oct. 1–4, 1992 San Francisco, Preprint 3377 using two polynomial filters. One polynomial filter (model filter) is adaptive and is connected in parallel to the transducer. It is used for the identification of the loudspeaker's kernel functions. The second polynomial filter (correction filter) is connected to the loudspeaker's input and performs the preprocessing of the electric transducer signal. This filter is not adaptive and the coefficients are permanently copied from the model filter into the correction filter. However, an additional polynomial filter increases the number elements and the costs of the distortion reduction circuit. In many practical applications two polynomial filters with the required frequency resolution can not be implemented in available DSP-systems in real time processing.

Adaptive filters based on transducer oriented filter structure are not disclosed in prior art.

SUMMARY

Thus there is a need for a truly adaptive correction filter to reduce the nonlinear and/or linear distortions of the transducer and produce a desired linear transfer characteristic of the overall system.

The main purpose of the invention is to adjust a correction filter to the transducer and to determine the optimal filter parameters in tile normal operation mode reproducing an audio or other signals. This invention omits off-line pre-training using special test signals (e.g. multi-tone-signals, noise) in an additional learning procedure.

A second purpose is to develop an adaptive correction filter with a transducer oriented structure to reduce the number of elements and filter parameters.

Another purpose is to realize a correction filter for transducers which adapts on-line for changing transducer characteristics caused by temperature, ageing and so on. The correction filter is always optimally adjusted and the total system shows the desired performance after a long operation time.

A final purpose is to provide a correction system for transducers comprising a minimum of elements to implement this system in a digital signal processor (DSP) at low costs.

These objections are reached by using a correction system which comprises a nonlinear correction filter, a sensing circuit anti a controller.

The correction filter is based either on generic nonlinear system structures (e.g. polynomial filters) or on transducer oriented structures (e.g. mirror filter). The output of the filter is connected with the input of the transducer. The parameters of the correction filter are controlled by external control signals supplied to the control inputs of the filter. Internal signals in the correction filter, called gradient signals, are supplied via additional outputs of the filter to the controller to update the filter parameters.

In the sensing circuit an electric or a mechanic or an acoustic signal at the transducer is measured, is compared with the response of a desired system and an error signal is provided for the controller.

The controller performs the updating of the filter parameters by minimizing the rms-value of the error signal. The controller provides control signals to the correction filter which are generated from the error signal and the gradient signals. The controller contains an error filter and/or gradient filters which perform a filtering of the error signal and gradient signals, respectively, to compensate for the linear transfer characteristic of the transducer-sensor-system. The response of either the gradient or the error filter is identified by an additional adaptive filter to compensate for changes in transducer parameters on-line.

DETAILED DESCRIPTION

Figure 1:
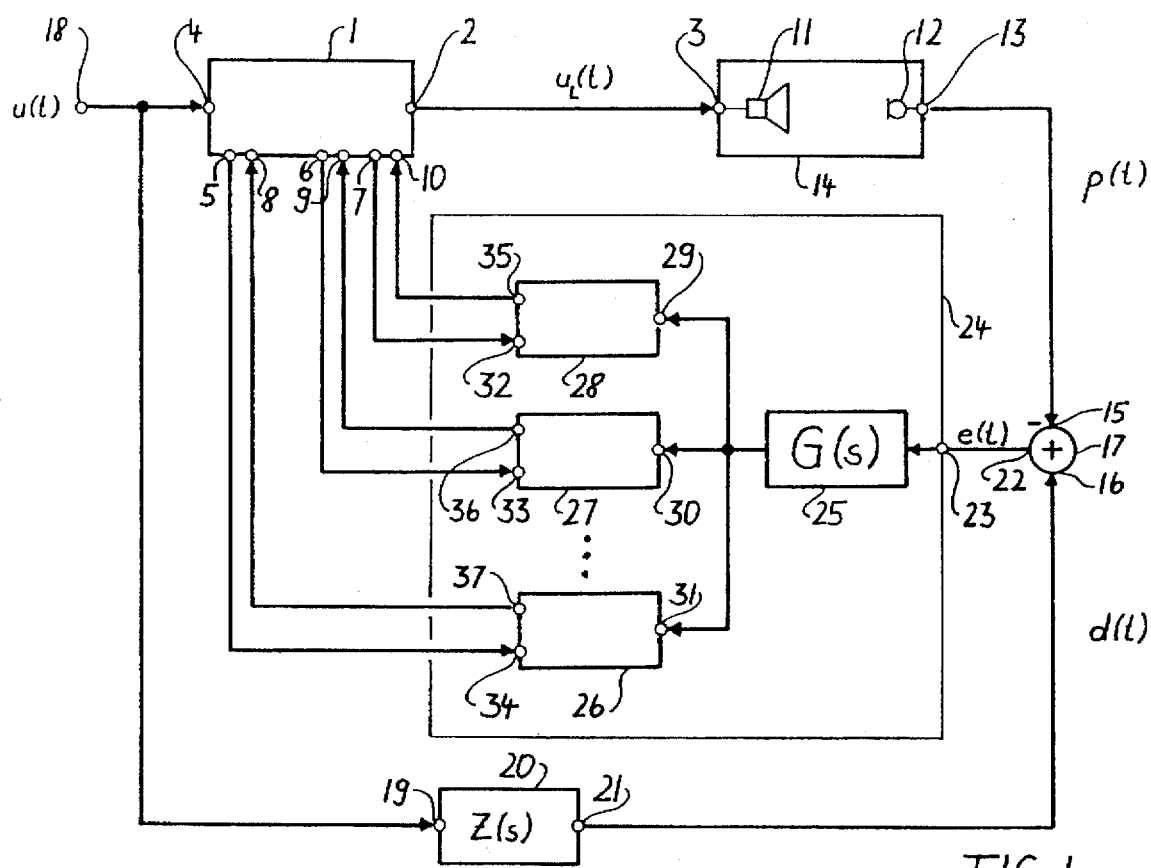
FIG. 1 is a general block diagram of the invention.

FIG. 1 shows the general block diagram of the adaptive correction circuit according to the present invention. The correction filter 1 is connected with its output 2 to the electric input 3 of the transducer 11. The sensor 12, the summer 17 and the linear reference filter 20 form the sensing circuit. The general input 18, supplying a signal u(t), e.g. an audio signal, is connected with the input 19 of the reference filter 20 which shows the desired transfer characteristic of the overall system. The output 21, which supplies a desired signal d(t), is connected with the non-inverting input 16 of the summer 17. The output 13 of the sensor 12, which senses an acoustic or a mechanic or an electric signal p(t) of the transducer 11, is connected with the inverting input 15 of the summer 22. The error signal e(t) at the output 22 with $$e(t)=d(t)-p(t) \quad (1)$$

is supplied to the input 23 of the controller 24. The controller comprises a circuit 25 and for every filter parameter $P_i$ (i=1, ..., N) a corresponding sub-controller represented in FIG. 1 for N=3 by sub-controllers 26, 27, 28. The error signal e(t) is supplied via the circuit 25 to the inputs 31, 30, 29 of the sub-controllers 26, 27, 28. Every sub-controller 26, 27 or 28 has an output 37, 36, 35, which is connected to the corresponding input 8, 9, 10 of the correction filter 1 to adjust the filter parameters $P_i$ (i=1, ..., N), respectively. The correction filter 1 has additional outputs 5, 6, 7 to supply the gradient signals $b_i(t)$ (i=1, ..., N) to the corresponding inputs 34, 33, 32 of the sub-controllers 26, 27, 28.

Figure 2:
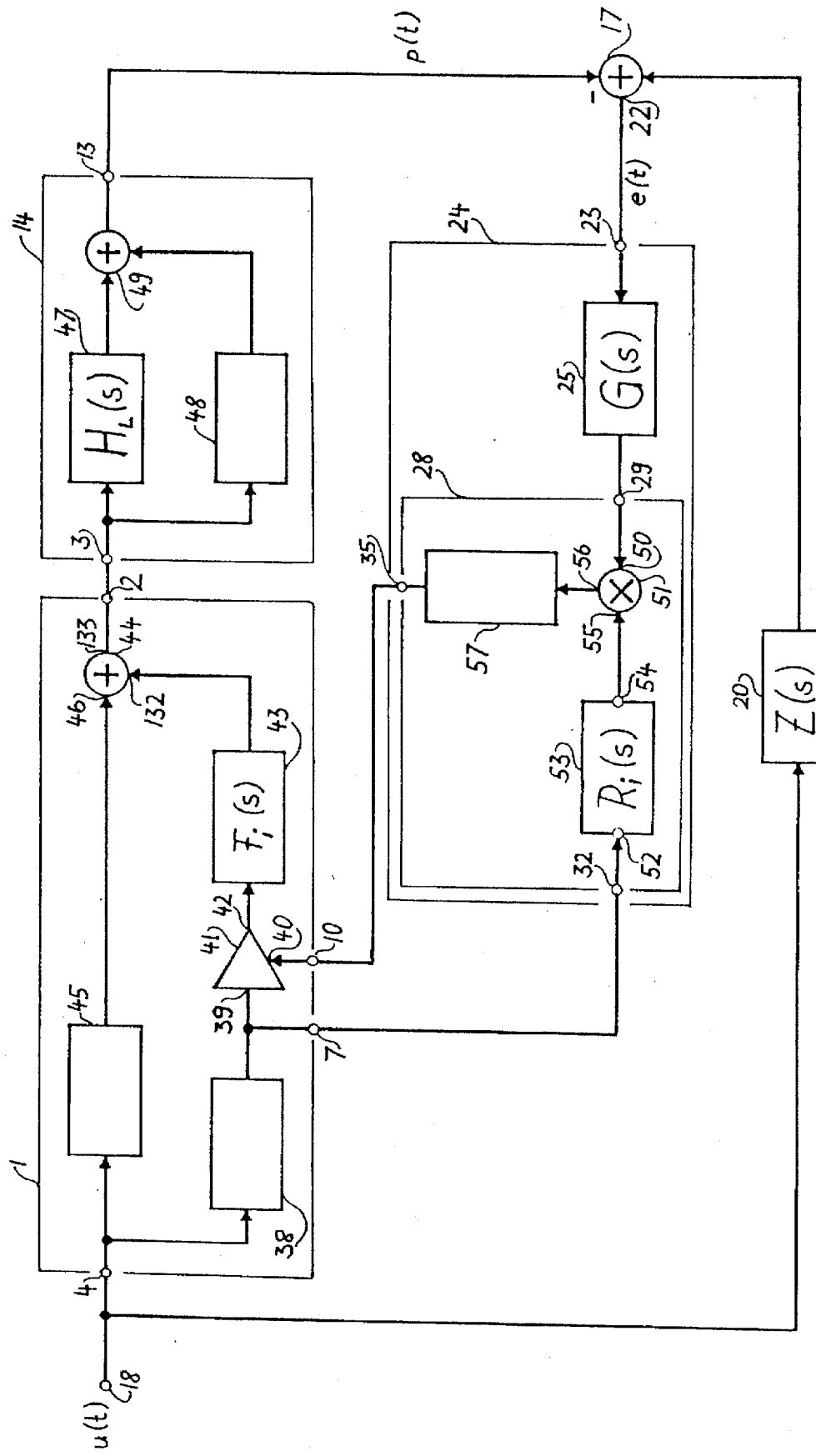
FIG. 2 shows a sub-controller for the adaptive adjustment of one filter parameter.

FIG. 2 shows the basic structure of the correction filter 1, a model of the transducer-sensor-system 14 and the elements of one sub-controller 28 in more details.

The correction filter 1 comprises for every filter parameter $P_i$ (i=1, ..., N) a linear or nonlinear sub-circuit and a multiplier or an amplifier with controllable gain. FIG. 2 shows only a sub-circuit 38 and a amplifier 41 corresponding to one filter parameter $P_j$ for simplicity. The filter part with the remaining filter parameters $P_i$ (i=1, ..., N; i≠j) are contained in the circuit 45 and have the same structure as the depicted circuit for parameter $P_j$. The filter input 4 is connected to the input of the sub-circuit 38. The output of the sub-circuit 38 is supplied via the amplifier 41 directly or via an additional linear or nonlinear circuit 43 to the input 132 of an adder 44. Assuming that the circuit 43 is linear or only weak nonlinear, the circuit 43 can be approximately described by the linear transfer function $F_j(s)$. Using this assumption the correction filter can be modeled by a linear combiner and the signal $u_L(t)$ at output 2 is the sum $$u_L(t) = \sum_{i=1}^{N} P_i b_i(t) * f_i(t) \quad (2)$$

where $b_i(t)$ is the signal at the output of the sub-circuit 38, $f_j(t)=L^{-1}\{F_j(s)\}$ is the impulse response of the circuit 43 which corresponds via the inverse Laplace-transform $L^{-1}$ with the system function $F_j(s)$ and the notation * stands for the convolution operator.

The polynomial filter fulfills this model with $f_i(t)=\delta(t)$ (i=1, ..., N) completely. The used delta-function is defined by $\delta(t)=1$ for t=0 and $\delta(t)=0$ for t≠0.

Figure 3:
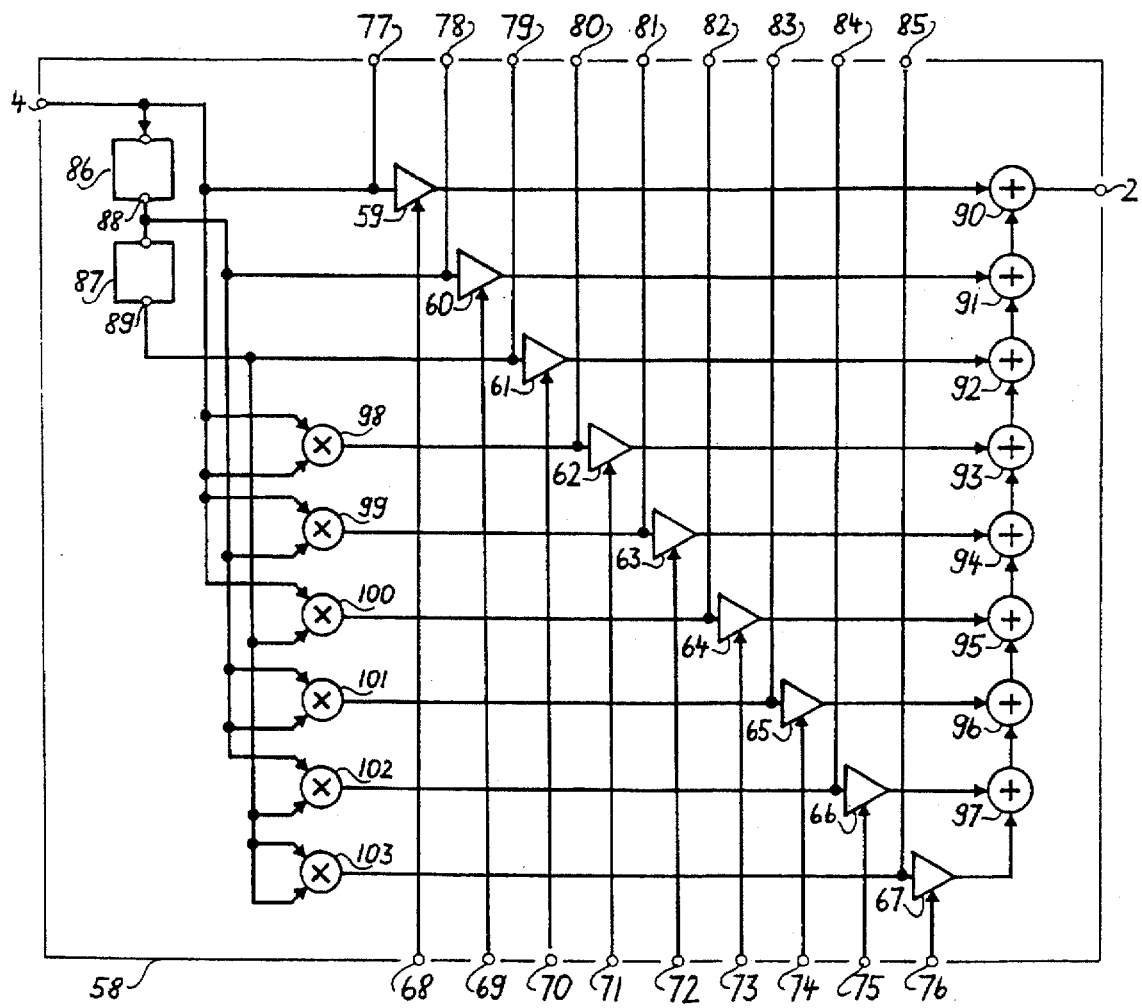
FIG. 3 shows a second-order polynomial filter with additional outputs for the gradient signals and additional inputs for controlling the filter parameters.

FIG. 3 shows for example a time-discrete second-order polynomial filter with two delay elements 86, 87. The signal at the filter input 4 is supplied directly and via the delay elements 86, 87, which are connected in series, to the multipliers 98, 99, 100, 101, 102, 103, which multiply the signals at input 4 and output 88 and 89 in all possible combinations. The linear signals at the input 4 and all the outputs 88, 89 and the nonlinear signal at the outputs of the multiplier 98–103 are scaled by the amplifier 59, 60, 61, 62, 63, 64, 65, 66, 67 and summed by the adders 90, 91, 92, 93, 94, 95, 96, 97. The linear and nonlinear signals at the input of the amplifiers 59–67 are supplied as gradient signals via the outputs 77, 78, 79, 80, 81, 82, 83, 84, 85 of the filter to the controller 24. The gain of the amplifiers 59–67 is controlled by the inputs 68, 69, 70, 71, 72, 73, 74, 75, 76.

The transducer oriented filter (mirror filter) can either be transformed or at least can be approximated by the basic structure depicted in FIG. 2 to make the parameter adjustment adaptive. The mirror filter disclosed by W. Klippel entitled CORRECTION OF LINEAR TRANSFER CHARACTERISTICS AND REDUCTION OF NONLINEAR DISTORTION FOR ELECTROACOUSTIC TRANSDUCERS, U.S. patent application Ser. No. 07/867, 314 filed April 1992, has a block-structure containing linear dynamic systems and static nonlinear systems. To adjust the nonlinear parameters the static nonlinear blocks can be realized by a series expansion (e.g. Taylor series) or any other nonlinear structure using a linear combiner at the output (e.g. neural networks). The linear blocks can be implemented as linear transversal filter with unit delays (FIR-filter) or with general transfer functions (GAMMA-filter) which provide the required linear combiner structure.

Figure 4:
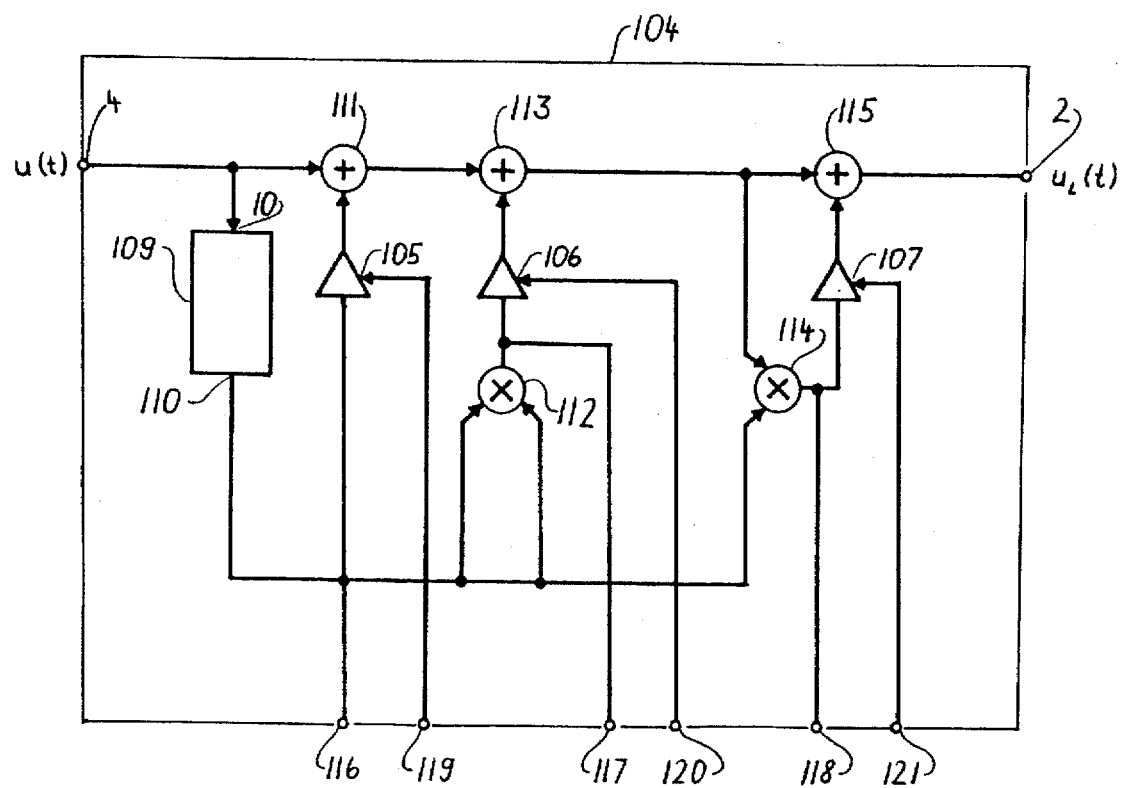
FIG. 4 is a transducer oriented filter (mirror filter) with outputs for the gradient signals and inputs for controlling the filter parameters.

FIG. 4 shows a transducer oriented filter 104 to compensate for the second-order nonlinear distortions caused by displacement varying stiffness of the suspension and displacement varying force-factor describing the electrodynamic drive. This filter also allows to correct the linear transfer behavior by changing the cut-off frequency of the total system as described in Klippel, W.: The Mirror filter—a New Basis for Reducing Nonlinear Distortion Reduction and Equalizing Response in Woofer Systems, J. Audio Eng. Soc. 32 (9), p. 675–691, (1992). This correction circuit 104 contains only one linear filter 109. This filter transforms the electric signal at input 4 to a signal which is equivalent to the displacement x(t) of the voice coil. The output 110 of this filter is connected to the static nonlinearities which are implemented in 104 by multipliers and amplifiers based on a power-series-expansion truncated after the linear term. Scaling the displacement signal by amplifier 105 and adding this signal to the input signal by summer 111 correspond with the constant term in the Taylor-expansion of the stiffness nonlinearity. This parameter allows to correct the constant stiffness of the transducer virtually and effects the cut-off frequency of the total system. The linear term of the stiffness nonlinearity is realized by squaring the displacement signal x(t) by multiplier 112, scaling the squared signal by amplifier 106 and adding this signal to the input signal by summer 113. A control signal at input 120 allows to compensate for an asymmetric stiffless characteristic of the transducer's suspension. The correction of a linear dependence of force-factor on displacement—corresponding with an asymmetric force-factor characteristic—is realized by connecting the outputs of 109 and 113 with the inputs of the multiplier 114. The output of the multiplier 114 is supplied via amplifier 107 to the adder 115 which adds the correction signal to the electric driving signal.

All the signals at inputs of the amplifiers 105, 106, 107 are supplied via the outputs 116, 117, 118, respectively, to the controller 24. The controller updates the filter parameters and supplies an control signal via the inputs 119, 120, 121 to the control inputs of the amplifiers 105, 106, 107, respectively. The output 2 of the filter 1 is connected to the input 3 of the transducer 11.

The sensor 12 in FIG. 1 measures an acoustic, an electric or a mechanic signal at the transducer 11. The transfer of the electric signal at the transducer's terminals 3 to the sensed signal at output 13 of the sensor 12 is modeled in FIG. 2 by the parallel connection of a linear system 47 with the impulse response $h_L(t)=L^{-1}\{H_L(s)\}$ and a nonlinear system 48 which produces nonlinear distortions $p_D(t)$. The signal at the output 13 of the sensor 12

$$p(t)=h_L(t)*u_L(t)+p_D(t) \quad (3)$$

is the sum of the input signal $u_L(t)$ convoluted with the impulse response $h_L(t)$ and the nonlinear driver distortions $p_D(t)$.

The controller 24 contains for every filter parameter $P_i$ (i=1, ..., N) a sub-controller. FIG. 2 shows only one sub-controller 28 corresponding to parameter $P_j$ which comprises a multiplier 51, a circuit 53 with the system function $R_j(s)$ and a circuit 57. The error signal e(t) from the output 22 of the sensing circuit is supplied via the circuit 25 with the system function G(s) to the input 50 of the multiplier 51. The gradient signal from the output 7 is supplied via the circuit 53 to the other input 55 of the multiplier 51. The output 56 of the multiplier 51 is connected via the circuit 57 to the control input 40 of the controllable amplifier 41. The circuit 57 performs the updating of the filter parameters with a suitable adaptive algorithm, e.g. method of steepest descent, least-mean-square (LMS) or recursive-least-squares (RLS). The LMS-algorithm can easily be implemented and requires for the circuit 57 only an integrator or low-pass. To improve the performance of the adaptive algorithm the circuit 57 can show some nonlinear characteristic. If the amplitude of the error signal e(t) is large due to a missing signal p(t) at the output 13 of the sensor the adjustment can be interrupted and the correction filter works with stored parameters.

The circuits 25 and 53 with the system response G(s) and $R_j(s)$, respectively, have to correspond with the transfer characteristics of the filter 1 and the transducer-sensor-system 14 to insure a fast and stable convergence of the filter parameters. The requirements of the system responses G(s) and $R_i(s)$ shall be derived in the following:

Inserting Eqs. (2) and (3) into (1) leads to the error signal $$e(t) = d(t) - p(t) \qquad (4)$$
$$= d(t) - p_D(t) - \sum_{i=1}^{N} P_i b_i(t) * f_i(t) * h_L(t)$$

which is now a function of the unknown filter parameters $P_i$.

Defining a cost function $$J(t) = [g(t) * e(t)]^2 \qquad (5)$$

as the squared value of the error convoluted with the impulse response $g(t) = L^{-1}\{G(s)\}$ of the system 25 the minimum of the cost function can be determined by the partial differentiation of Eq. (5)

$$\frac{\partial J(t)}{\partial P_i} = -2[g(t) * f_i(t) * h_L(t) * b_i(t)] \times [g(t) * e(t)] \qquad (6)$$
$$= -2[r_i(t) * b_i(t)] \times [g(t) * e(t)]$$

$i \in \{1, 2, \ldots, N\}$.

This gradient is important for updating the filter parameter in an iterative process. The averaged gradient leads to the method of steepest descent $$P_i[n+1] = P_i[n] - \mu E\left[\frac{\partial J}{\partial P_i}\right] \qquad (7)$$

$i \in \{1, 2, \ldots, N\}$ with the positive convergence parameter $\mu$ and the expectation value E[ ]. In many practical applications it is advantageous to omit the averaging of the gradient and use the more simpler least mean square (LMS) algorithm which requires only an integrator in 57.

Eq. (6) specifies the further elements in controller 24 shown in FIG. 2. The multiplication $$P_i[n+1] = P_i[n] - \mu \left[\frac{\partial J[n]}{\partial P_i[n]}\right] \qquad (8)$$

$i \in \{1, 2, \ldots, N\}$ (operator x) is realized by the multiplier 50. The impulse response $r_i(t)$ $$r_i(t) = f_i(t) * h_L(t) * g(t) \qquad (9)$$

and the Laplace transformed system function $$R_i(s) = F_i(s) H_L(s) G(s) \qquad (10)$$

is required for all circuits in the gradient path represented in FIG. 2 by circuit 53.

If the circuit 43 and all the other corresponding circuits contained in 45 have the system function $F_i(s)=1$ for all i=1, ..., N, then the circuit 53 in 28 and the corresponding circuits in the other sub-controllers have the same system function $$R_i(s) = H_L(s) G(s) \qquad (11)$$

Eqs. (11) and (10) show the relationship between the system functions G(s) and $R_i(s)$. There is one degree of freedom in defining the system functions G(s) and $R_i(s)$. From practical point of view it is useful to make either G(s) or $R_i(s)$ as simple as possible to realize circuit 25 or circuit 53 by a delay element or by a direct connection. The other circuit 53 and 25, respectively, can be realized by a linear adaptive filter to compensate for changes of the transducer parameters on-line.

In the first embodiment all circuits in the gradient signal path, represented in FIG. 2 by circuit 53, are realized by delay elements with the system function $$R_i(s) = e^{-\tau s}. \qquad (12)$$

The delay time $\tau$ is required to ensure that the transfer element 25 with the system function $$G(s) = \frac{e^{-\tau s}}{H_L(s) F_i(s)} \qquad (13)$$

is causal and can be realized by a linear filter, called error filter.

Figure 5:
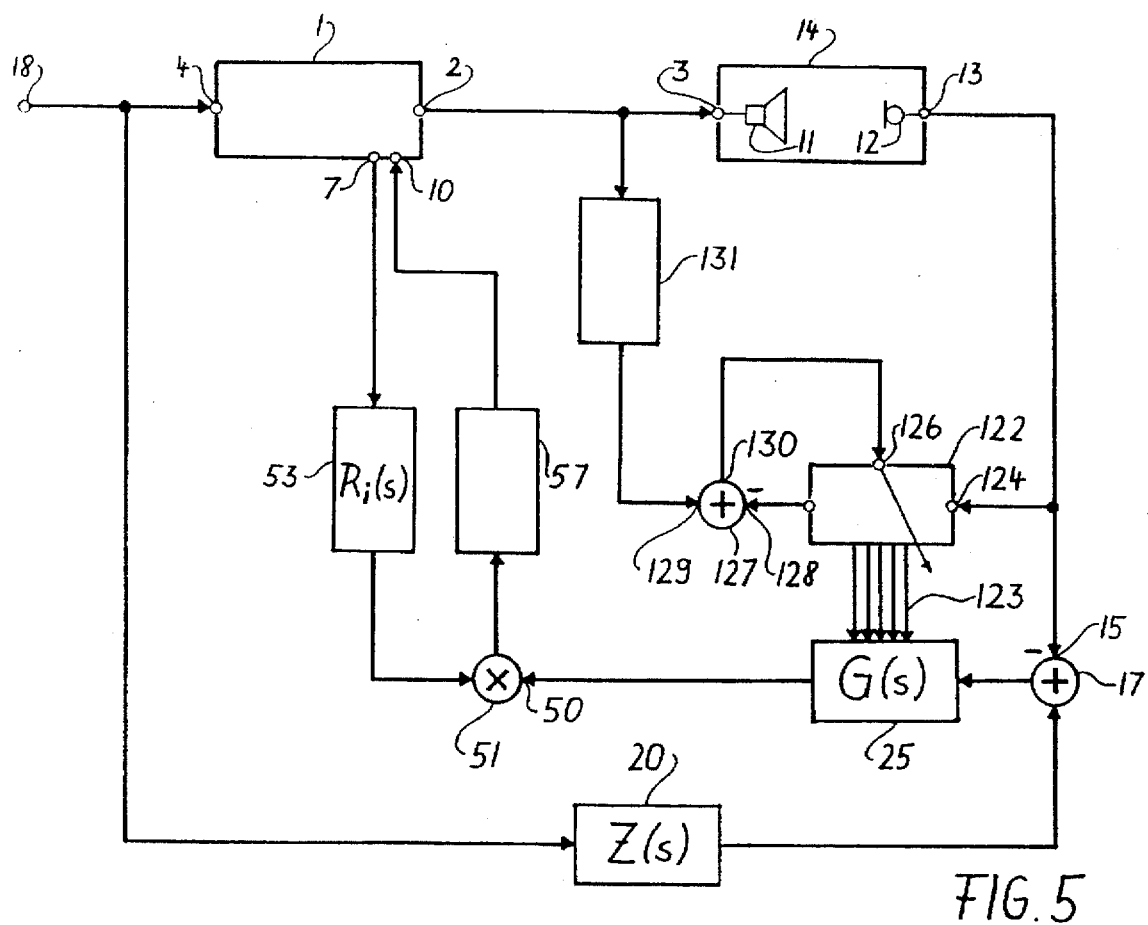
FIG. 5 shows the adaptive adjustment of the error filter.

FIG. 5 shows the adaptive adjustment of the linear filter 25 by inverse system identification using a model filter 122. The linear filters 25 and 122 have the same feed-forward (FIR) or recursive structure (IIR) to model the transducer in the interesting frequency range. Only the filter 122 is adaptive using an straightforward algorithm (e.g. LMS). The electric input 3 of the transducer is connected via a delay-element 131, which has the same time delay as 53, with the non-inverting input 129 of the summer 127. The output 13 of the sensor 12 is connected via the linear adaptive filter 122 with the inverting input 128 of the summer 127. The error signal at the output 130 of the summer 127 are fed back to the error input 126 of the adaptive filter 122. The parameters of the model filter 122 are permanently copied to the filter 25 by using the connections 123.

Figure 6:
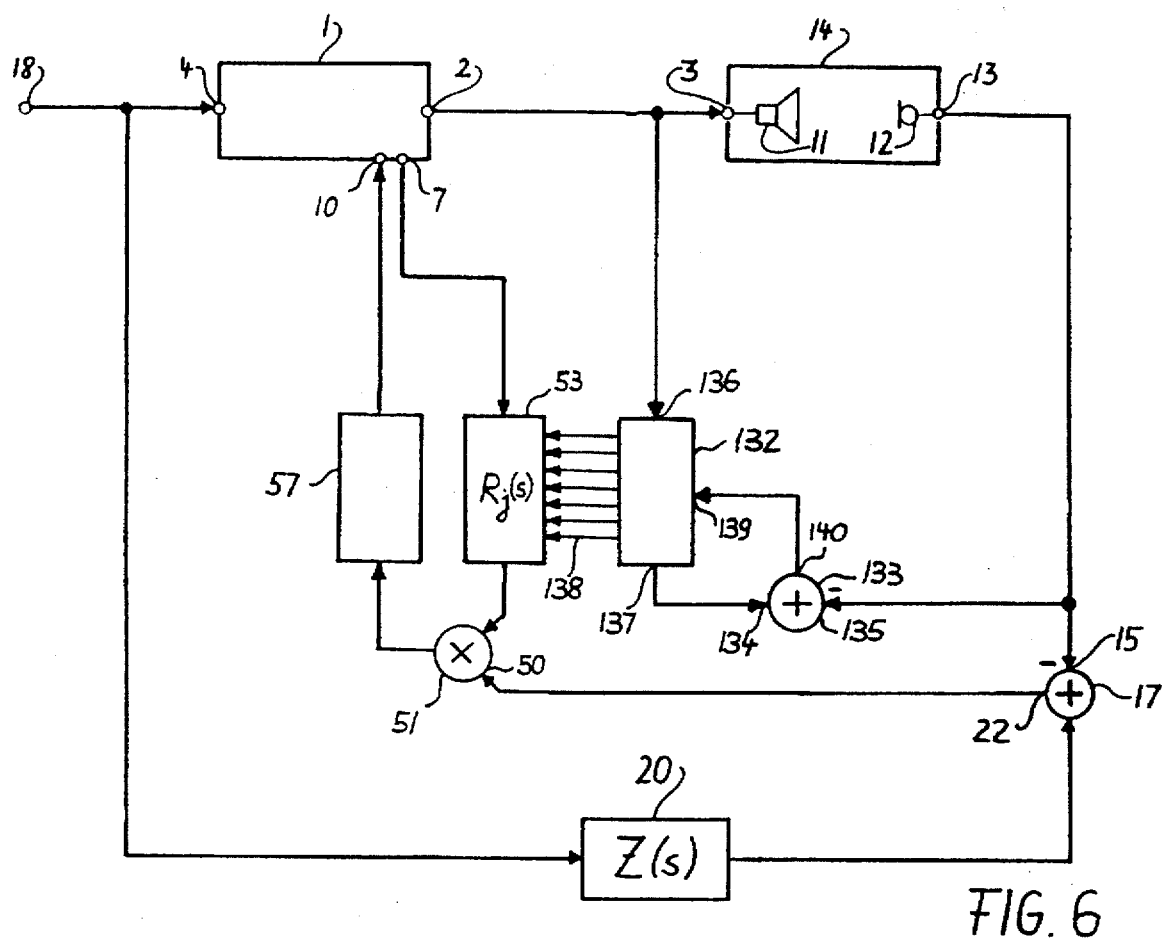
FIG. 6 shows the adaptive adjustment of the gradient filter.

The case G(s)=1 leads to another important embodiment as shown in FIG. 6 which requires only a direct connection from the output 22 of the summer 17 to the input 50 of the multiplier 51. Every gradient path contains a linear gradient filter, represented in FIG. 6 by filter 53, with the system response $$R_i(s) = F_i(s) H_L(s). \qquad (14)$$

If the $F_i(s)=1$ for all $i=1,\ldots,N$ the gradient filters in all sub-controllers 26, 27, 28, ... have the system function $H_L(s)$ of the transducer-sensor-system. This system function is identified by an additional linear adaptive filter 132 and copied to all gradient filters represented in FIG. 6 by filter 53. The adaptive filter 132 has an additional error input 139 to supply the error signal which is required for the used updating algorithm (e.g. LMS-algorithm). The electric input 3 of the transducer 11 is connected to the input 136 of the adaptive linear filter 132 and the output 137 is combined to the non-inverting input 134 of the summer 133. The other inverting input 135 of the summer 133 is connected to the output 13 of the sensor 12. The output 140 of the summer 133 which supplies a second error signal is connected to the error input 139 of the adaptive filter 132. The parameters of the model filter 132 are permanently copied to the filter 53 by using the connections 138.

The above description shall not be construed as limiting the ways in which this invention may be practiced but shall be inclusive of many other variations that do not depart from the broad interest and intent of the invention.

What is claimed is:

1. An arrangement for converting an electric input signal into an acoustic or a mechanic output signal using a transducer and additional means for compensating for distortions of said transducer adaptively in normal working mode to realize a desired overall transfer characteristic of the said arrangement without pre-training, wherein said means comprises:

a correction filter with controllable linear or nonlinear transfer characteristic having a filter input supplied with said input signal and filter output connected to the electric input of said transducer for realizing said desired overall transfer characteristic between said input signal and said output signal, said correction filter also having for every controllable filter parameter a control input for changing said filter parameter and a gradient output for providing a gradient signal;

a sensing circuit having an error output for providing an error signal, said error signal describing the deviation of the instantaneous overall transfer characteristic of said filter connected with said transducer from said desired overall transfer characteristic; and a controller having an error input connected to said error output, said controller also having for every said filter parameter a gradient input and control output, every said gradient input being connected to corresponding said gradient output and every said controller output being connected to corresponding said control input for generating a control signal to adjust adaptively corresponding said filter parameter and for reducing the amplitude of said error signal, wherein said controller contains for every said filter parameter one update circuit having a first update input and a second update input and an update output and said update output is connected via said controller output to said control input for adjusting corresponding said filter parameter.

2. The invention according to claim 1 wherein:

said controller also contains for every said filter parameter one gradient filter having an input and an output;

every said gradient input is separately connected via said gradient filter to said first update input for providing a filtered gradient signal to corresponding said update circuit and for adjusting said filter parameter; and said error input is connected to said second update input for providing said error signal for all said update circuit contained in said controller.

3. The invention according to claim 1 wherein:

said controller also contains an error filter having an input connected to said error input and an output connected to said second update input for providing a filtered error signal for all said update circuit contained in said controller; and every said gradient input is connected to said first update input of corresponding said update circuit for adjusting all said filter parameters.

4. The invention according to claim 1 wherein:

said controller also contains an error filter having an input connected to said error input and an output connected to said second update input for providing a filtered error signal for all said update circuit contained in said controller;

said controller also contains for every said filter parameter one gradient filter having an input and an output; and every said gradient input is separately connected via said gradient filter to said first update input for providing a filtered gradient signal to corresponding said update circuit and for adjusting said filter parameter.

5. The invention according to claim 1 wherein said update circuit comprises a multiplier having a input connected to said first update input, another input connected to said second update input and a multiplier output for providing the product of both input signals; and a integrator having an input connected to said multiplier output and an output connected to the output of said update circuit for realizing a LMS-update algorithm.

6. The invention according to claim 2 wherein said controller also contains a linear adaptive filter having a model filter input, a model filter output and a model filter error input for adaplively modeling the transducer-sensor-system without dedicated off-line pre-training, said model filter input being connected to said electric input of said transducer;

a summer having an inverting and a non-inverting input and a summer output for producing a second error signal, the output of said linear adaptive filter being connected to one input of said summer, the output of said transducer-sensor-system being connected to the other input of said summer and said summer output being connected to said model filter error input; and connections from said linear adaptive filter to said gradient filter for copying the parameters of said linear adaptive filter to every said gradient filter contained in said controller and for adaplively compensating for the transfer characteristic of said transducer-sensor-system on-line.

7. The invention according to claim 3 wherein said controller also contains a linear adaptive filter having a model filter input, a model filter output and a model filter error input for adaptively modeling the inverse transducer-sensor-system without dedicated off-line pre-training, said model filter input being connected to the output of said transducer-sensor-system;

a summer having an inverting and a non-inverting input and a summer output for producing a second error signal, said model filter output being connected to one input of said summer, said electric input of said transducer being connected to the other input of said summer and said summer output being connected to said model filter error input; and connections from said linear adaptive filter to said error filter for copying the parameters of said linear adaptive filter into the error filter and for adaptively compensating the transfer characteristic of said transducer-sensor-system on-line.

8. The invention according to claim 4 wherein said controller also contains a linear adaptive filter having a model filter input, a model filter output and a model filter error input for adaptively modeling the inverse transducer-sensor-system without dedicated off-line pre-training, said model filter input being connected to the output of said transducer-sensor-system;

a delay circuit having an input and an output for delaying the electric input signal of said transducer;

a summer having an inverting and a non-inverting input and a summer output for producing a second error signal, said model filter output being connected to one input of said summer, said electric input of said transducer being connected via said delay circuit to the other input of said summer and said summer output being connected with said model filter error input; and connections from said linear adaptive filter to said error filter for copying the parameters of said linear adaptive filter into the error filter and for adaptively compensating the transfer characteristic of said transducer-sensor-system on-line.

9. The invention according to claim 1 wherein said sensing circuit comprises a reference filter having an input connected to said filter input and a reference filter output for producing a desired signal from said input signal;

a sensor having a sensor output for providing a mechanic, an acoustic or an electric signal of the transducer; and a summer having an inverting input connected to said sensor output, a non-inverting input connected to said reference filter output and an output connected to said error output for providing said error signal for said controller.

10. An arrangement for converting an electric input signal into an acoustic or a mechanic output signal using a transducer and additional means for compensating for distortions of said transducer adaptively in normal working mode to realize a desired overall transfer characteristic of the said arrangement without pre-training, wherein said means comprises:

a correction filter with controllable linear or nonlinear transfer characteristic having a filter input supplied with said input signal and filter output connected to the electric input of said transducer for realizing said desired overall transfer characteristic between said input signal and said output signal, said correction filter also having for every controllable filter parameter a control input for changing said filter parameter and a gradient output for providing a gradient signal;

wherein said correction filter comprises an input circuit having an input connected to said filter input; also having for every said filter parameter an output connected to corresponding said gradient output for providing a gradient signal;

a controllable amplifier for every said filter parameter having a signal input also connected to the output of said input circuit, a gain control input connected to said control input and an amplifier output for providing a scaled gradient signal; and a output circuit having an input for every said filter parameter and an output connected to said filter output; every said amplifier output being connected to corresponding input of said output circuit;

a sensing circuit having an error output for providing an error signal, said error signal describing the deviation of the instantaneous overall transfer characteristic of said filter connected with said transducer from said desired overall transfer characteristic; and a controller having an error input connected to said error output, said controller also having for every said filter parameter a gradient input and control output, every said gradient input being connected to corresponding said gradient output and every said controller output being connected to corresponding said control input for generating a control signal to adjust adaptively corresponding said filter parameter and for reducing the amplitude of said error signal.

* * * * *